US008213477B2

(12) United States Patent
Kobayashi

(10) Patent No.: US 8,213,477 B2
(45) Date of Patent: Jul. 3, 2012

(54) SEMICONDUCTOR LASER AND METHOD OF MANUFACTURING THE SAME

(75) Inventor: Ryuji Kobayashi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 261 days.

(21) Appl. No.: 12/705,275

(22) Filed: Feb. 12, 2010

(65) Prior Publication Data

US 2010/0202485 A1   Aug. 12, 2010

(30) Foreign Application Priority Data

Feb. 10, 2009   (JP) ................................. 2009-029124

(51) Int. Cl.
  *H01S 5/00*   (2006.01)
(52) U.S. Cl. ................. 372/46.01; 372/44.01; 372/43.01
(58) Field of Classification Search ............... 372/46.01, 372/44.01, 43.01
  See application file for complete search history.

(56) References Cited

U.S. PATENT DOCUMENTS

| | | | | |
|---|---|---|---|---|
| 5,771,256 A | * | 6/1998 | Bhat | 372/45.01 |
| 5,882,951 A | * | 3/1999 | Bhat | 438/40 |
| 2004/0080814 A1 | * | 4/2004 | Ohki et al. | 359/344 |

FOREIGN PATENT DOCUMENTS

JP   2003-133647 A   5/2003

OTHER PUBLICATIONS

T. Okuda, et al., "Low-Operation-Current and Highly-Reliable 1.3-μm AlGaInAs Strain Compensated MQW-BH-DFB Lasers for 100° C, 10-Gb/s Operation", The Optical Fiber Communications Conference, 2004, Conference Digest, ThD3, pp. 65-67.
Hitoshi Watanabe, et al., "1.3-μm Uncooled DFB Lasers with Low Distortion for CATV Application", IEEE Journal of Selected Topics in Quantum Electronics, Apr. 1997, pp. 659-665, vol. 3, No. 2.

* cited by examiner

*Primary Examiner* — Kinam Park
(74) *Attorney, Agent, or Firm* — Sughrue Mion, PLLC

(57) ABSTRACT

Provided is a semiconductor laser including: a substrate (semiconductor substrate); an optical waveguide (active layer waveguide) with a mesa structure that includes an active layer (strain-compensated multiple quantum well active layer) including Al, is provided over the semiconductor substrate; a semiconductor protective layer that is provided so as to cover the top and the side of a mesa of the active layer waveguide; a current block layer that is provided so as to embed the active layer waveguide and the semiconductor protective layer; and a clad layer (p-type InP clad layer) that is provided over the semiconductor protective layer and the current block layer, wherein, the semiconductor protective layer has a semiconductor layer (p-type InGaAsP protective layer) that includes As, but does not include Al.

7 Claims, 16 Drawing Sheets

US 8,213,477 B2

SEMICONDUCTOR LASER AND METHOD OF MANUFACTURING THE SAME

The application is based on Japanese patent application No. 2009-029124, the content of which is incorporated hereinto by reference.

BACKGROUND

1. Technical Field

The present invention relates to a semiconductor laser and a method of manufacturing the same.

2. Related Art

Semiconductor lasers using an AlGaInAs quantum well in an active layer can perform laser oscillation with a low threshold current and high efficiency, or direct modulation at a high speed of more than 10 Gb/s even in a high-temperature environment, as compared to when InGaAsP is used. The reason is that, since the band offset of the conduction band of AlGaInAs quantum well is large, a strong electron confinement occurs, it is possible to prevent the overflow of electrons from an active layer at a high temperature, and a high differential gain is obtained. As a result, a semiconductor laser capable of performing direct modulation at a speed of 10 Gb/s without adjusting the temperature is manufactured.

There is an increasing demand for a 10 Gb/s small optical transceiver that can be mounted with high density and has a low power consumption, with an increase in transmission capacity. In particular, a high-speed small form-fact or pluggable (SFP+) optical transceiver has a power consumption of 1 W or less, and it is necessary to reduce the operation current of the semiconductor laser used in the optical transceiver.

An embedded structure capable of injecting a current into the active layer with high efficiency is used in order to reduce the operation current of the semiconductor laser. The semiconductor laser with an embedded structure using the InGaAsP quantum well in the active layer can be formed by forming a mesa structure using etching and forming a current block layer using buried growth. However, when the same process is applied to AlGaInAs quantum well, the side of the active layer is oxidized by etching for forming the mesa structure. As a result, it is difficult to manufacture a high-reliability semiconductor laser.

Therefore, T. Okuda, et al., "Low-Operation-Current and Highly-Reliable 1.3-μm AlGaInAs Strain Compensated MQW-BH-DFB Lasers for 100° C., 10-Gb/s Operation", The Optical Fiber Communications Conference, 2004, Conference Digest, ThD3, pp. 65-67, or Japanese Unexamined Patent Publication No. 2003-133647 discloses a structure in which a semiconductor waveguide with a mesa shape including Al is formed by selective growth, and a p-type InP protective layer 10 is continuously grown so as to cover the entire waveguide, thereby completely preventing the oxidation of a semiconductor layer (strain-compensated multiple quantum well active layer 6) including Al, as shown in FIG. 18.

As a result, a high-reliability semiconductor laser with an embedded structure using an AlGaInAs quantum well in an active layer is achieved which is stably operated for 4,000 hours at a temperature of 85° C. and has a median life of 100,000 hours or more (FIG. 19). FIGS. 18 and 19 are disclosed in T. Okuda, et al.

However, the related art disclosed in the above-mentioned documents has the following problems.

When the growth time of the protective layer is shortened in order to reduce the thickness of the top of the mesa in terms of a reduction in leakage current, the thickness of the side of the mesa of the protective layer is reduced. As a result, the active layer including Al is likely to be exposed and oxidized.

As a result, it is difficult to manufacture a high-reliability semiconductor laser with high yield.

FIG. 20 is an enlarged cross-sectional view illustrating near the active layer waveguide of the semiconductor laser shown in FIG. 19. In T. Okuda, et al., an n-type InGaAsP guide layer 3, an n-type InP buffer layer 4, and a strain-compensated multiple quantum well active layer 6 made of AlGaInAs are formed on an n-type InP substrate 1. The waveguide with a mesa structure including the strain-compensated multiple quantum well active layer 6 is covered with a p-type InP protective layer 10. In the semiconductor laser shown in FIG. 20, an Fe-doped high-resistance InP layer 11 and an n-type InP layer 12 are used as the current block layers. The Fe-doped high-resistance InP layer 11 is used to reduce the parasitic capacitance of the device in order to achieve a high-speed operation. However, the Fe-doped high-resistance InP layer 11 traps electrons, but does not trap holes. Therefore, a portion of a hole current injected through the p-type InP clad layer 13 leaks through the p-type InP protective layer 10 and the high-resistance InP layer 11 (the leakage current is represented by an arrow in FIG. 20).

In order to reduce the leakage current, it is effective to reduce the distance dw between the n-type InP current block layer 12 and the active layer waveguide corresponding to the width of a leakage path (dw is shown in FIG. 20).

FIG. 21 is an enlarged cross-sectional view illustrating the active layer waveguide with a mesa shape shown in FIG. 18. The active layer waveguide including the strain-compensated multiple quantum well active layer 6 is formed in an opening of a pair of silicon oxide masks 17 by selective growth and is then covered with the p-type InP protective layer 10. The width dw of the leakage path is equal to the thickness dt of the top of the mesa of the p-type InP protective layer 10 shown in FIG. 21 (dt is shown in FIG. 21). Therefore, it is necessary to decrease the thickness dt in order to reduce the width dw of the leakage path.

However, when the growth time of the InP protective layer is shortened in order to reduce the thickness dt, the thickness ds of the side of the mesa of the p-type InP protective layer 10 is also reduced (ds is shown in FIG. 21). As a result, the strain-compensated multiple quantum well active layer 6 including Al is likely to be exposed and oxidized.

In Japanese Unexamined Patent Publication No. 2003-133647, in order to increase the ds/dt ratio, the (100) plane of the semiconductor substrate is inclined in the [011] direction or the [0-1-1] direction, or the growth conditions of the InP protective layer are optimized to increase the thickness ds of the side of the mesa. As a result, as described in the first to third embodiments of Japanese Unexamined Patent Publication No. 2003-133647, the thickness dt of the top of the mesa of the p-type InP protective layer is 200 nm, and the thickness ds of the side of the mesa is in the range of 20 nm to 30 nm. Therefore, a mesa shape having a ds/dt ratio of 0.1 to 0.15 is formed.

However, in Japanese Unexamined Patent Publication No. 2003-133647, since the thickness dt of the top of the mesa of the p-type InP protective layer corresponding to the width dw of the leakage path is 200 nm, it is necessary to decrease the thickness dt to reduce the leakage current. In addition, similar to T. Okuda, et al., when the growth time of the InP protective layer is shortened in order to reduce the thickness dt, the thickness ds is also reduced. As a result, the strain-compensated multiple quantum well active layer including Al is likely to be exposed and oxidized.

SUMMARY

In one embodiment, there is provided a semiconductor laser including: a substrate; an optical waveguide with a mesa structure, that includes an active layer including Al, and is provided over the substrate; a semiconductor protective layer that is provided so as to cover the top and the side of the mesa of the optical waveguide; a current block layer that is provided so as to embed the optical waveguide and the semiconductor protective layer; and a clad layer that is provided over the semiconductor protective layer and the current block layer, wherein, the semiconductor protective layer has a semiconductor layer that includes As, but does not include Al.

In a process of manufacturing the semiconductor laser including the semiconductor protective layer having the semiconductor layer that includes As, but does not include Al, since the semiconductor protective layer includes As, it is possible to ensure the thickness of the side of the mesa of the semiconductor protective layer. In addition, since the semiconductor protective layer does not include Al, it is possible to prevent the oxidation of the active layer including Al.

In another embodiment, there is provided a method of manufacturing a semiconductor laser including: forming a mesa-shaped optical waveguide having an active layer including Al on a substrate; forming a semiconductor protective layer including a semiconductor layer that includes As, but does not include Al so as to cover the top and the side of a mesa of the mesa structure; embedding the optical waveguide and the semiconductor protective layer with a current block layer; and forming a clad layer over the semiconductor protective layer and the current block layer.

Since the semiconductor protective layer includes As, it possible to prevent the migration of the semiconductor on the mesa of the mesa structure. Therefore, it is possible to form the semiconductor protective layer such that the thickness of the side of the mesa is large. In this way, it is possible to control the ratio between the thickness of the top of the mesa of the semiconductor protective layer and the thickness of the side of the mesa.

In addition, since the semiconductor protective layer does not include Al, it is possible to prevent the oxidation of the active layer including Al.

According to the above-mentioned embodiments of the invention, since the semiconductor protective layer includes As, it is possible to ensure the thickness of the side of the mesa of the semiconductor protective layer. In addition, since the semiconductor protective layer does not include Al, it is possible to prevent the oxidation of the active layer including Al. Therefore, it is possible to provide a structure capable of producing a high-reliability semiconductor laser with high yield and a method of manufacturing the same.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
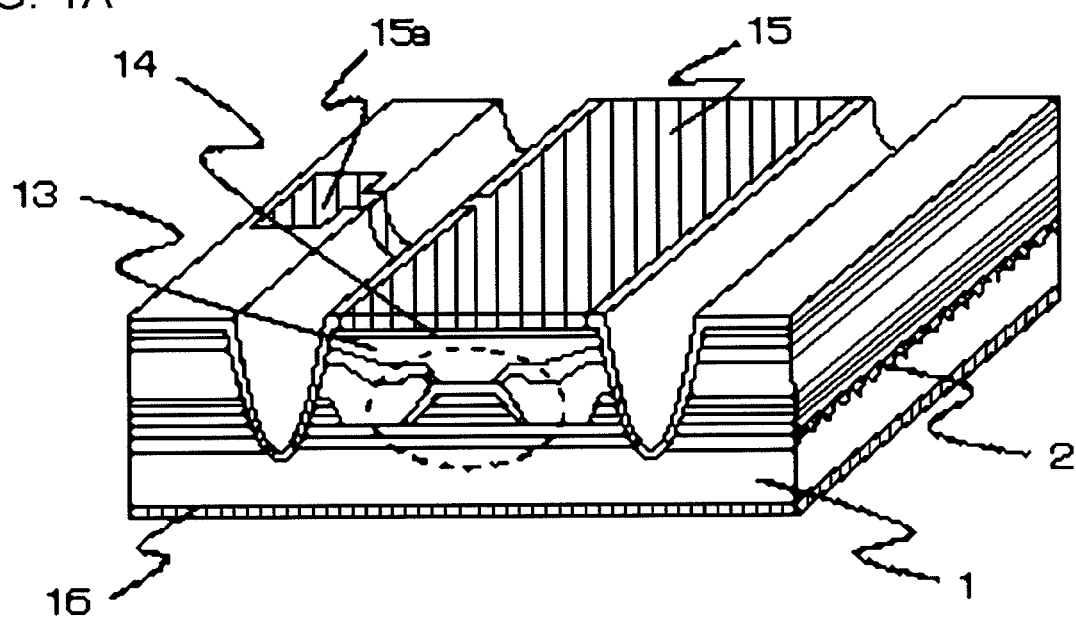
FIG. 1A is a bird's eye view illustrating a distributed-feedback semiconductor laser according to a first embodiment of the invention in which InGaAsP is used in a protective layer of an active layer waveguide.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the same components are denoted by the same reference numerals and description thereof will not be repeated.

First Embodiment

Figure 1B:
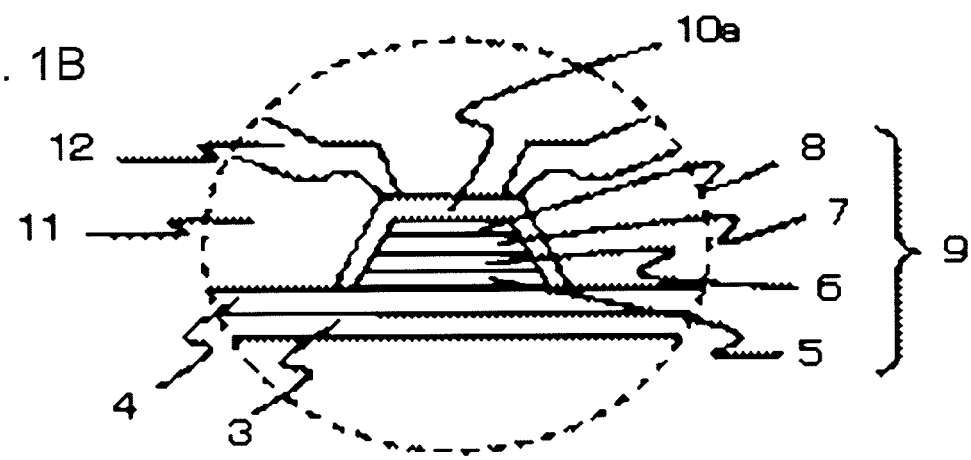
FIG. 1B is a cross-sectional view illustrating near the active layer waveguide.

FIGS. 1A and 1B are a bird's eye view (FIG. 1A) illustrating a distributed-feedback semiconductor laser (DFB-LD) with an embedded structure according to a first embodiment of the invention that includes an AlGaInAs quantum well active layer in which InGaAsP is used in a protective layer and a cross-sectional view (FIG. 1B) illustrating near an active layer waveguide, respectively.

The semiconductor laser according to this embodiment includes a substrate (a semiconductor substrate), an optical waveguide (an active layer waveguide 9) with a mesa structure that is provided on the semiconductor substrate and has an active layer (a strain-compensated multiple quantum well active layer 6) including Al, a semiconductor protective layer that is provided so as to cover the top and the side of the mesa of the active layer waveguide 9, a current block layer (an Fe-doped high-resistance InP current block layer 11 and an n-type InP current block layer 12) that is provided so as to embed the active layer waveguide 9 and the semiconductor protective layer, and a clad layer (a p-type InP clad layer 13) that is provided on the semiconductor protective layer and the current block layer (an n-type InP current block layer 12). The semiconductor protective layer has a semiconductor layer (a p-type InGaAsP protective layer 10a) that includes As, but does not include Al.

The semiconductor laser includes an n-type InGaAsP guide layer 3, an n-type InP buffer layer 4, an n-type AlGaInAs optical guide layer 5, a strain-compensated multiple quantum well active layer 6, a p-type AlGaInAs optical guide layer 7, a p-type AlInAs electron overflow prevention layer 8, a p-type InGaAs contact layer 14, a p-side electrode 15, and a p-side pad electrode 15a shown in FIG. 1.

In this embodiment, a case in which the n-type InP substrate 1 is used as the semiconductor substrate will be described. In this embodiment, the semiconductor protective layer may be a semiconductor layer including a group III-V compound semiconductor. The semiconductor protective layer may be a single layer or a multi-layer structure. The active layer waveguide 9 includes the n-type AlGaInAs optical guide layer 5, the strain-compensated multiple quantum well active layer 6, the p-type AlGaInAs optical guide layer 7, and the p-type AlInAs electron overflow prevention layer 8.

As shown in FIG. 1A, a diffraction grating 2 is formed on the n-type InP substrate 1 (carrier concentration n=2×10$^{18}$ cm$^{-3}$) having the (100) plane as a growth plane. The diffraction grating 2 is covered with the n-type InGaAsP guide layer 3 (n=1×10$^{18}$ cm$^{-3}$; no strain; and a wavelength corresponding to a band gap is 1130 nm), and the n-type InP buffer layer 4 (d=30 nm, and n=1×10$^{18}$ cm$^{-3}$) is formed on the n-type InGaAsP guide layer 3. The pitch of the diffraction grating 2 is 202 nm. Then, the active layer waveguide 9 with a mesa shape is formed which includes the n-type AlGaInAs optical guide layer 5 (d=50 nm, n=5×10$^{17}$ cm$^{-3}$, and no strain), the strain-compensated multiple quantum well active layer 6 including an AlGaInAs well layer (d=6 nm, undoped, 1.0% compression strain, and 10 layers) and an AlGaInAs barrier layer (d=10 nm, undoped, 0.4% tensile strain, and 11 layers), the p-type AlGaInAs optical guide layer 7 (d=50 nm, carrier concentration p=5×10$^{17}$ cm$^{-3}$ and no strain), and the p-type AlInAs electron overflow prevention layer 8 (d=20 nm, p=1× 10$^{18}$ cm$^{-3}$, and no strain). In addition, the p-type InGaAsP protective layer 10a (p=1×10$^{18}$ cm$^{-3}$, no strain, and a wavelength corresponding to the band gap is 1170 nm) is formed so as to cover the entire active layer waveguide 9 (at least the top and the side of the mesa). Scanning electron microscope (SEM) observation showed that the thickness of the top of the mesa of the p-type InGaAsP protective layer 10 was 60 nm and the thickness of the side of the mesa was 40 nm. The thickness is an average value of the measured values.

Here, the (100) plane at the top of the active layer waveguide 9 with the mesa structure is referred to as the top of the mesa, and the (111)B plane, which is the side surface of the active layer waveguide 9 with the mesa structure, is referred to as the side of the mesa.

The active layer waveguide 9 and the p-type InGaAsP protective layer 10a are embedded in the Fe-doped high-resistance InP current block layer 11 (d=600 nm and electron trap concentration=5×10$^{17}$ cm$^{-3}$) and the n-type InP current block layer 12 (d=200 nm and n=1×10$^{18}$ cm$^{-3}$).

The p-type InP clad layer 13 (d=1500 nm and p=1×10$^{18}$ cm$^{-3}$) and the p-type InGaAs contact layer 14 (d=300 nm, p=1×10$^{19}$ cm$^{-3}$, and no strain) are formed on the p-type InGaAsP protective layer 10a and the n-type InP current block layer 12 which are over the upper part of the mesa.

The p-side electrode 15 is formed on the p-type InGaAs contact layer 14, and the n-side electrode 16 is formed on the rear surface of the n-type InP substrate 1 which is thinned by polishing.

Next, a manufacturing process will be described. FIGS. 2 to 8 are diagrams illustrating a process of manufacturing the DFB-LD with an embedded structure according to the first embodiment of the invention that includes an InGaAsP protective layer and an AlGaInAs quantum well active layer.

A method of manufacturing a semiconductor laser according to this embodiment includes: a process of forming a mesa-shaped optical waveguide having an active layer (the strain-compensated multiple quantum well active layer 6) including Al on a substrate (the n-type InP substrate 1); a process of forming a semiconductor protective layer including a semiconductor layer (the p-type InGaAsP protective layer 10a) that includes As, but does not include Al so as to cover the top and the side of a mesa of the mesa structure; a process of embedding the active layer waveguide 9 and the semiconductor protective layer with a current block layer (the Fe-doped high-resistance InP current block layer 11 and the n-type InP current block layer 12); and a process of forming a clad layer (the p-type InP clad layer 13) on the semiconductor protective layer and the current block layer (the n-type InP current block layer 12).

In the process of forming the semiconductor protective layer, the semiconductor protective layer is formed by a vapor phase epitaxy method (metal organic vapor phase epitaxy method) using a source material gas (for example, AsH$_3$) that includes As, but does not include Al.

In this embodiment, crystal growth is performed by a metal organic vapor phase epitaxy (MOVPE) method. In InGaAsP growth, trimethylindium (TMIn), triethylgallium (TEGa), AsH$_3$, or PH$_3$ is used as the source material. In InP growth, TMIn or PH$_3$ is used as the source material. In AlGaInAs growth, trimethylaluminum (TMAl), TEGa, TMIn, or AsH$_3$ is used as the source material. In addition, disilane (Si$_2$H$_6$) and diethyizinc (DEZn) are used as n-type and p-type doping source materials, respectively.

Figure 2:
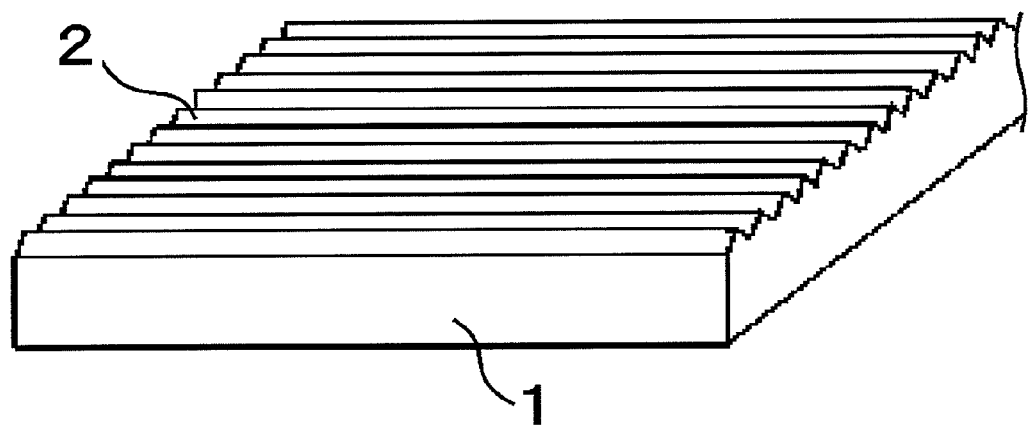
FIG. 2 is a bird's eye view illustrating a manufacturing process according to the first embodiment of the invention.

First, the diffraction grating 2 is formed on the n-type InP substrate 1 having the (100) plane as a growth plane (FIG. 2). The diffraction grating 2 may be formed by electron beam exposure and wet etching using a resist as a mask.

Figure 3:
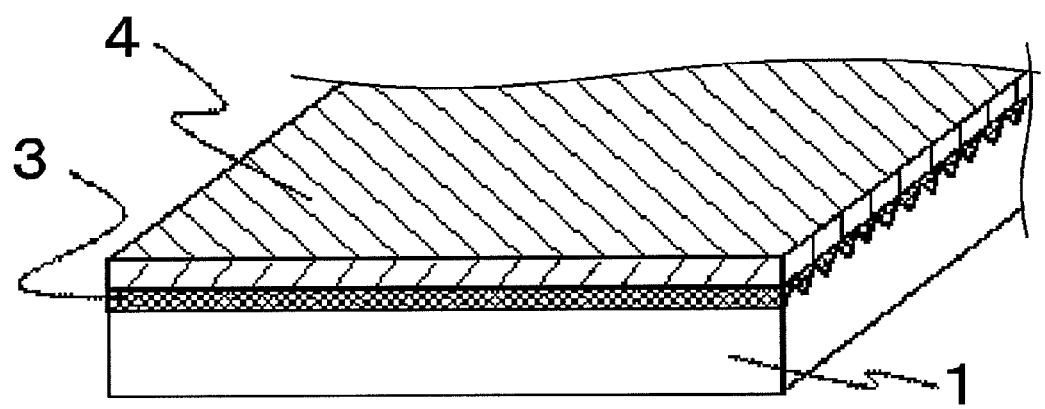
FIG. 3 is a bird's eye view illustrating the manufacturing process according to the first embodiment of the invention.

Then, the substrate is set in an MOVPE apparatus, the n-type InGaAsP guide layer 3 is grown so as to cover a whole surface of the diffraction grating 2, and the n-type InP buffer layer 4 is grown thereon (FIG. 3). The growth temperature is 625° C., the growth pressure is 1013 hPa, and the growth rate is 5 nm/minute.

Figure 4:
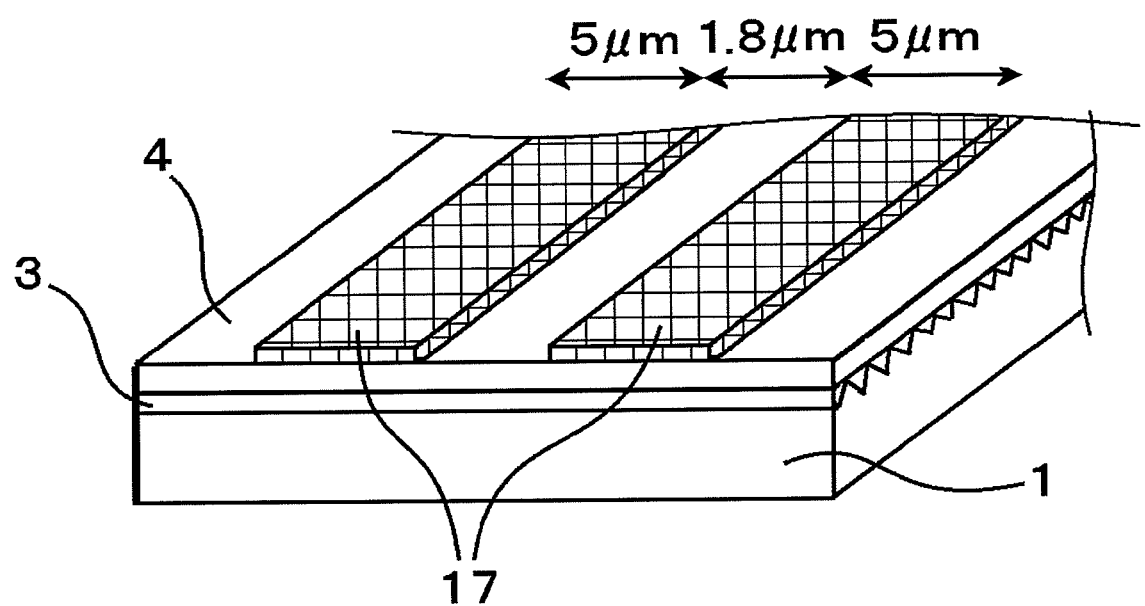
FIG. 4 is a bird's eye view illustrating the manufacturing process according to the first embodiment of the invention.

After the substrate is taken out from the MOVPE apparatus, a silicon oxide film with a thickness of 100 nm is deposited on the n-type InP buffer layer 4 by a thermal chemical vapor deposition (thermal CVD) method. Then, the silicon oxide film is processed into a pair of strip-shaped silicon oxide masks 17 with a mask width of 5 μm and an opening width of 1.8 μm by a photolithography technique (FIG. 4). The strip extends in the [011] direction.

Figure 5A:
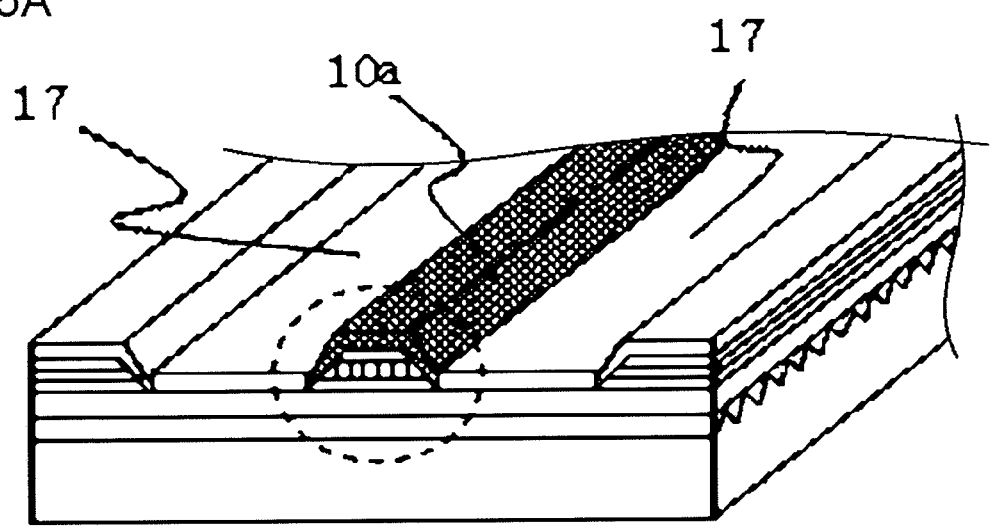
FIG. 5A is a bird's eye view illustrating the manufacturing process according to the first embodiment of the invention.
Figure 5B:
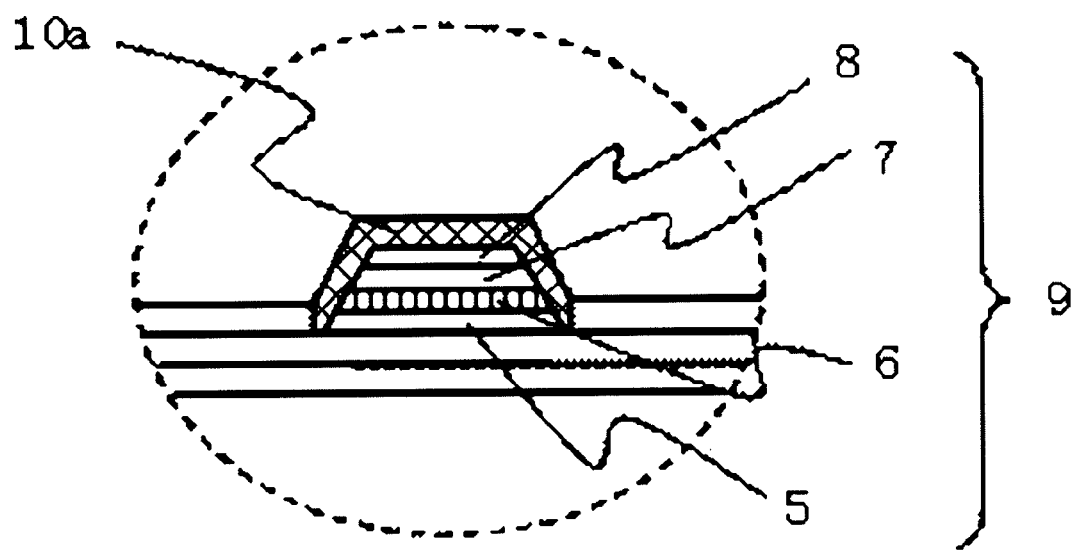
FIG. 5B is a cross-sectional view illustrating the manufacturing process according to the first embodiment of the invention.

Then, the substrate is set in the MOVPE apparatus, and the n-type AlGaInAs optical guide layer 5, the strain-compensated multiple quantum well active layer 6, the p-type AlGaInAs optical guide layer 7, and the p-type AlInAs electron overflow prevention layer 8 is selectively grown to form the active layer waveguide 9 with a mesa shape. Subsequently, the p-type InGaAsP protective layer 10a is continuously grown so as to cover the entire active layer waveguide 9 without being exposed to the atmosphere (FIGS. 5A and 5B). The growth temperature is 630° C., the growth pressure is 133 hPa, the growth rate of the AlGaInAs layer is 30 nm/minute, and the growth rate of the InGaAsP layer is 15 nm/minute. During the growth of the InGaAsP layer, a V/III ratio (the ratio of the supplied amount of group-V source material to the supplied amount of group-III source material) is 90. In this case, the p-type InGaAsP protective layer 10a is allowed to include Al in the range that is equal to the amount of Al which is inevitably mixed in the manufacturing process.

Figure 6:
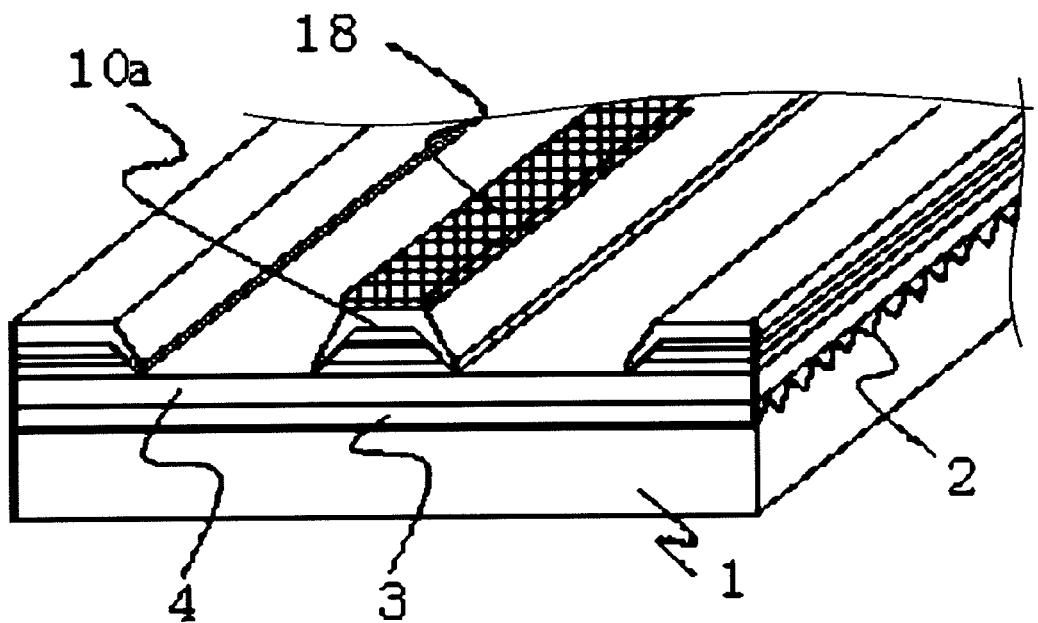
FIG. 6 is a bird's eye view illustrating the manufacturing process according to the first embodiment of the invention.

Thereafter, the substrate is taken out from the MOVPE apparatus, and a silicon oxide mask 18 is formed on only the top of the mesa by a self-alignment process (FIG. 6).

Figure 7:
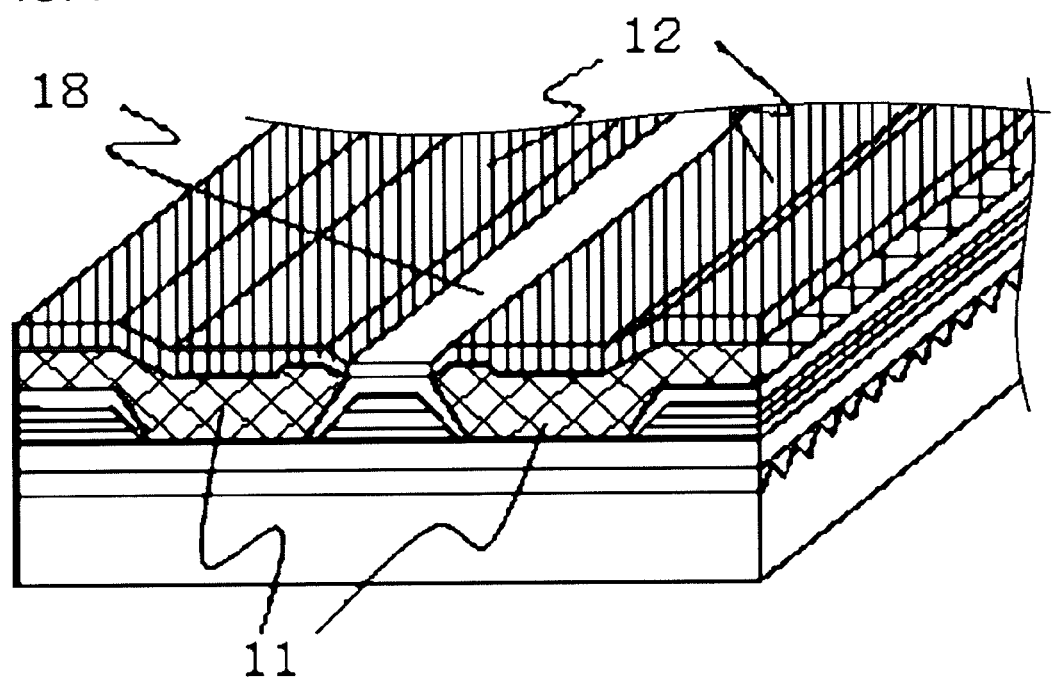
FIG. 7 is a bird's eye view illustrating the manufacturing process according to the first embodiment of the invention.

Then, the substrate is set in the MOVPE apparatus, and the Fe-doped high-resistance InP current block layer 11 and the n-type InP current block layer 12 are selectively grown so as to embed the active layer waveguide 9 and the p-type InGaAsP protective layer 10a (FIG. 7). The growth temperature is 630° C., the growth pressure is 133 hPa, and the growth rate is 20 nm/minute. However, in the process of increasing the temperature up to 630° C., $AsH_3$ and $PH_3$ are simultaneously supplied such that the surface state (the composition ratio of a group-V component) of the p-type InGaAsP protective layer 10a is not greatly changed.

Figure 8:
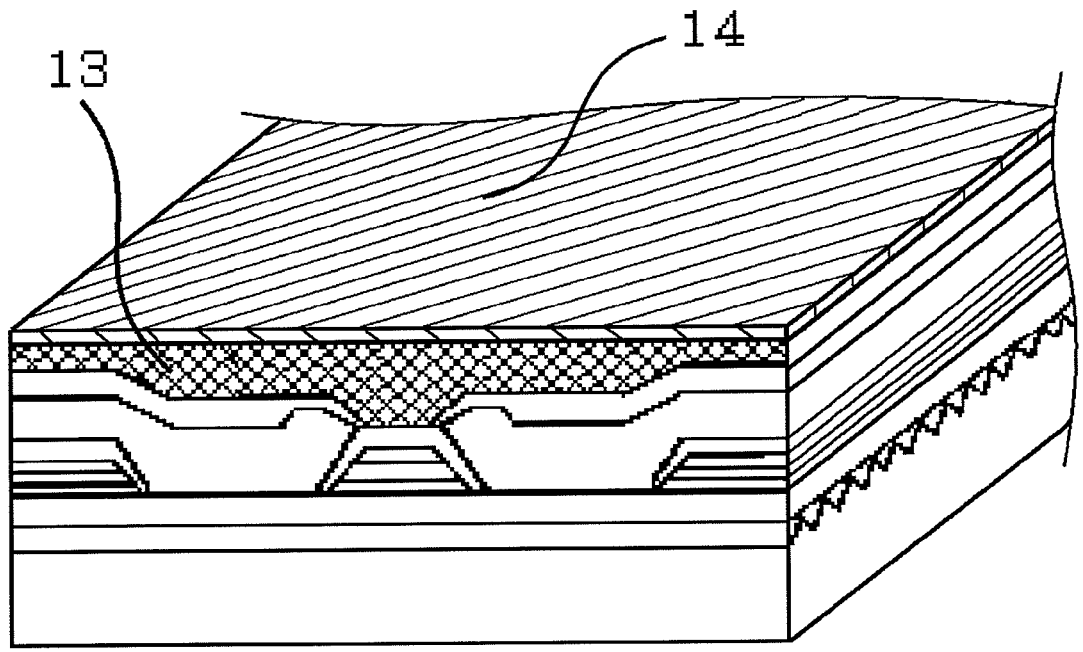
FIG. 8 is a bird's eye view illustrating the manufacturing process according to the first embodiment of the invention.

Then, the substrate is taken out from the MOVPE apparatus and the silicon oxide mask 18 is removed. Then, fourth MOVPE growth is performed to grow the p-type InP clad layer 13 and the p-type InGaAs contact layer 14 (FIG. 8). The growth temperature is 630° C., the growth pressure is 133 hPa, and the growth rate is 30 nm/minute. In the process of increasing the temperature up to 630° C., $AsH_3$ and $PH_3$ are simultaneously supplied such that the surface state (the composition ratio of a group-V component) of the p-type InGaAsP protective layer 10a is not greatly changed.

Figure 9:
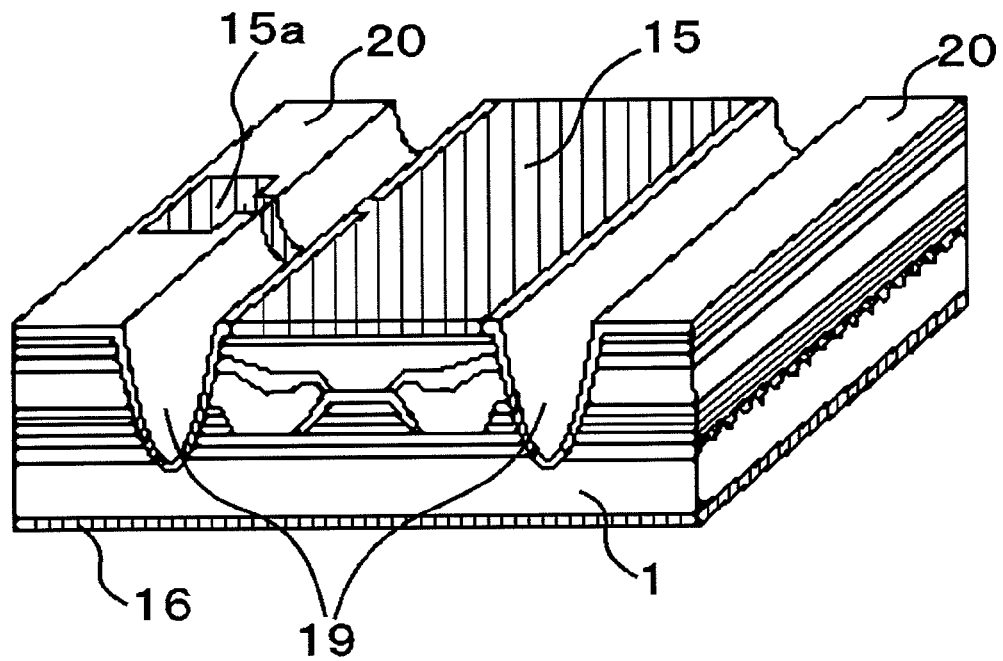
FIG. 9 is a bird's eye view illustrating the manufacturing process according to the first embodiment of the invention.

Then, a double channel structure 19 is formed in order to reduce element capacitance. Then, a silicon oxide film 20 is deposited on the p-type InGaAs contact layer 14. The silicon oxide film 20 where the p-side electrode is to be formed is removed in a strip shape. Then, the p-side electrode 15 is formed on the p-type InGaAs contact layer 14. Then, the n-type InP substrate 1 is thinned by polishing and the n-side electrode 16 is formed on the rear surface of the n-type InP substrate 1 (FIG. 9). However, a portion of the p-side electrode serves as the p-side pad electrode 15a in order to reduce the element capacitance.

The manufactured DFB-LD is cleaved to have a cavity length of 200 μm, and the both facet is coated such that the reflectivity of the front facet is 0.1% and the reflectivity of the rear facet is 75%. Then, laser characteristics are evaluated.

As a result, laser oscillation is obtained at a low threshold current, for example, at a threshold current of 5 mA at a temperature of 25° C. and at a threshold current of 16 mA at a temperature of 95° C. The oscillation wavelength is 1308 nm at a temperature of 25° C. and the gain peak wavelength is 1312 nm. The amount of detuning (the difference between the gain peak wavelength and the oscillation wavelength when the gain peak wavelength is a reference value) is −4 nm. The slope efficiency is 0.43 W/A at a temperature of 25° C. and 0.27 W/A at a temperature of 95° C., which is a high level. A variation in slope efficiency between 25° C. and 95° C. is −2.0 dB, which is a relatively small value.

The modulation characteristics at 10 Gb/s are evaluated under a fixed condition of a light output of 7 mW. As a result, a mask margin of 30% or more is obtained in the temperature range of −5° C. to 95° C. in which measurement is performed. In addition, a central current during modulation is 42 mA at a temperature of 95° C., which is a very small value. The value sufficiently satisfies a power consumption of 1 W or less in the SFP+ optical transceiver.

A reliability test is performed on the DFB-LD under the conditions of a temperature of 95° C. and a constant light output of 8.5 mW. As a result of the test, the DFB-LD is stably operated for 5,000 hours or more. The lifetime of the DFB-LD estimated from the increasing rate of an operation current is 100,000 hours or more.

Next, the operation and effects of this embodiment will be described. In this embodiment, when a semiconductor layer including As, such as an InGaAsP layer or an InAsP layer, is used as the protective layer, arsine ($AsH_3$) and phosphine ($PH_3$) are used as a group-V source material in crystal growth. Since $AsH_3$ and $PH_3$ do not contribute to crystal growth, they are thermally decomposed and react with a group-III source material to be incorporated into a crystal. As disclosed in H. Nagai, et al., "Photonics Series 6 Group III-V semiconductor crystal", Corona Publications, p. 146, line Nos. 8 to 13, FIGS. 3 and 23, the decomposition efficiency of $AsH_3$ is higher than that of $PH_3$. Therefore, even when the ratio (V/III ratio) of the supplied amount of group-V source material to the supplied amount of group-III source material, such as In or Ga, is constant, the effective V/III ratio of crystal growth using $AsH_3$ is higher than that of crystal growth using only $PH_3$ such as InP. The effective V/III ratio means the ratio of the amount of group-V element to the amount of group-III element contributing to crystal growth, not the V/III ratio calculated from the supplied amount.

When crystal growth is performed at a high V/III ratio, it is possible to prevent the migration of a group-III element, and the crystal growth of the side of the mesa, which is the (111)B plane, is enhanced. Therefore, when a semiconductor layer including As, such as an InGaAsP layer or an InAsP layer, is used as the protective layer, the thickness of the side of the mesa of the protective layer is more than that when only the InP layer is provided. As a result, it is possible to form a protective layer with a high ds/dt ratio and thus achieve a laser structure with a small leakage current.

In the process of manufacturing the semiconductor laser according to this embodiment that includes the protective layer having a semiconductor layer (the p-type InGaAsP protective layer 10a) that includes As, but does not include Al, since the semiconductor layer includes As, it is possible to ensure the thickness of the side of the mesa of the protective layer. Since the semiconductor layer does not include Al, it is possible to prevent the oxidation of the active layer including Al.

In the method of manufacturing the semiconductor laser according to this embodiment, As makes it possible to prevent the migration of group-III element on the side of the mesa of the mesa structure, and it is possible to form the mesa of the protective layer such that the thickness of the side of the mesa is large. In this way, it is possible to control the ratio between the thickness of the top of the mesa of the protective layer and the thickness of the side of the mesa. In addition, since the protective layer does not include Al, it is possible to prevent the oxidation of the active layer including Al.

Figure 20:
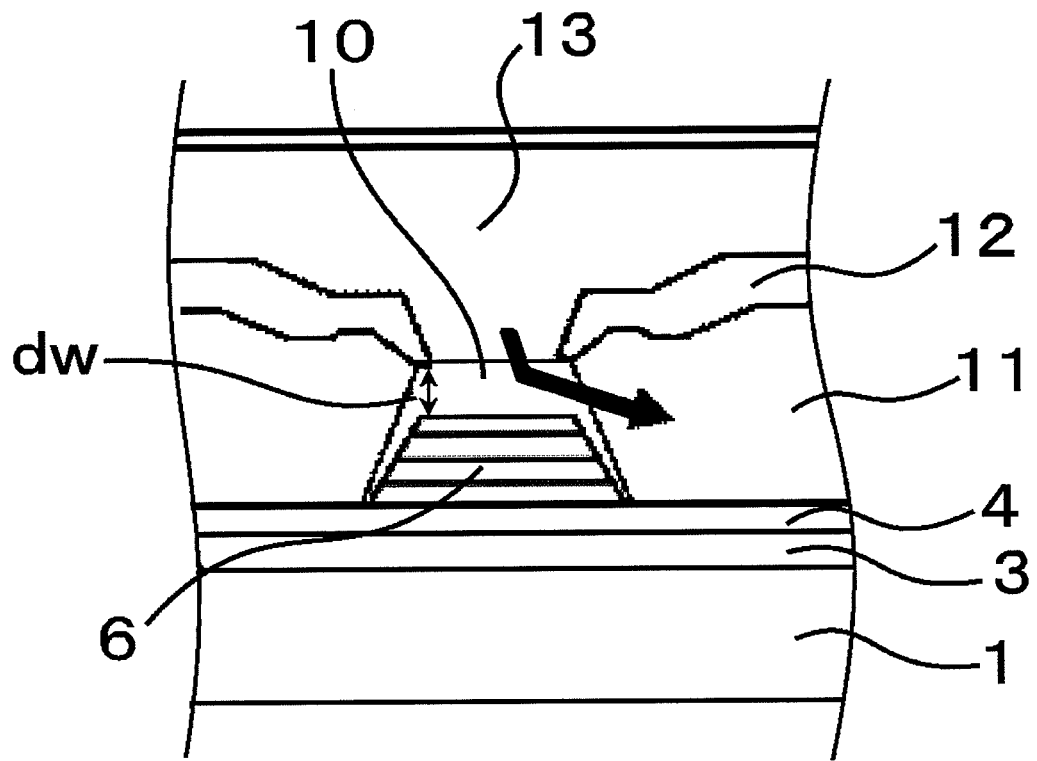
FIG. 20 is an enlarged cross-sectional view illustrating near an active layer waveguide shown in FIG. 19.
Figure 21:
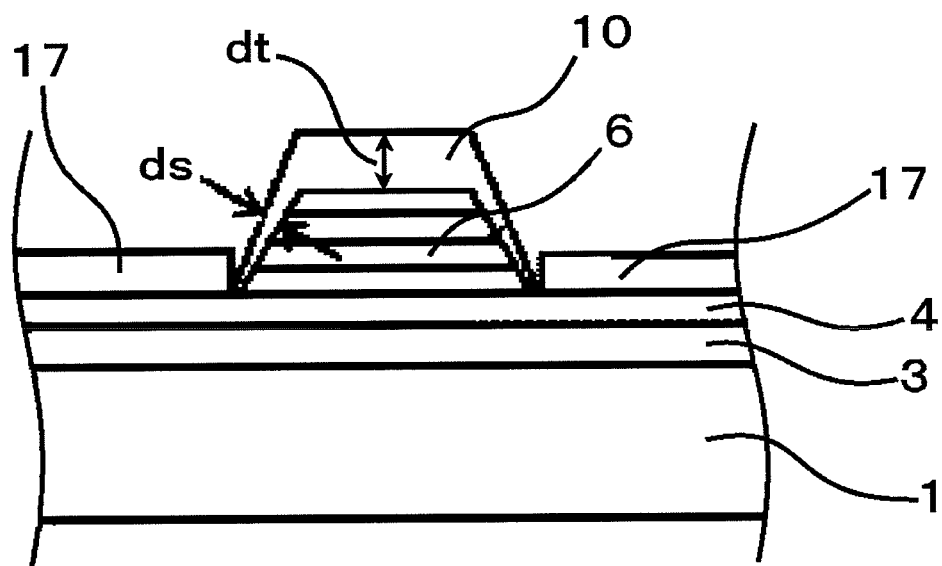
FIG. 21 is an enlarged cross-sectional view illustrating the mesa structure shown in FIG. 18.

H. Watanabe, et al., "1.3-μm Uncooled DFB lasers with Low Distortion for CATV Application," IEEE Journal of Selected Topics in Quantum Electronics, 1997, Vol. 3, No. 2, pp. 659-665 discloses the semiconductor laser with an embedded structure in which the current block layers are made of p-type InP and n-type InP and the width of a leakage path is equal to or less than 100 nm such that a leakage current (a leakage current represented by an arrow in FIG. 20) is almost negligible. Therefore, as disclosed in H. Watanabe, et al., it is necessary to further increase the ds/dt ratio in order to obtain a thickness of 100 nm or less that is sufficient to make the leakage current negligible.

In order to obtain a high ds/dt ratio, the protective layer is formed in a shape in which the thickness ds of the side of the mesa of the p-type InGaAsP protective layer 10a does not vary, but the thickness dt of the top of the mesa of the p-type InGaAsP protective layer 10a is reduced. In this way, it is possible to achieve laser oscillation with a low threshold current and high efficiency (high slope efficiency), without damaging reliability.

In this embodiment, an InGaAsP layer (a wavelength corresponding to the band gap is 1170 nm) is used as the protective layer of the active layer waveguide. As a result, the thickness of the top of the mesa of the p-type InGaAsP protective layer 10a is 60 nm, and the thickness of the side of the mesa is 40 nm. Therefore, a high ds/dt ratio of 0.67 is obtained. The ds/dt ratio is higher than that of the structure in which the InP layer is used as the protective layer disclosed in Japanese Unexamined Patent Publication No. 2003-133647. The thickness of the top of the mesa of the p-type InGaAsP protective layer 10a corresponding to the width of the leakage path is 60 nm, and it is possible to obtain a thickness of 100 nm or less that is sufficient to make the leakage current negligible. In addition, the thickness of the top of the mesa of the p-type InGaAsP protective layer 10a may be equal to or less than 20 nm in order to prevent the oxidation of the lower p-type AlInAs electron overflow prevention layer.

In this embodiment, when the thickness of the top of the mesa of the protective layer is dt and the thickness of the side of the mesa of the protective layer is ds, it is possible to achieve a semiconductor laser in which the ds/dt ratio is more than 0.15 and a method of manufacturing the semiconductor laser. In addition, it is possible to achieve a semiconductor laser in which the thickness of the top of the mesa of the p-type InGaAsP protective layer 10a is equal to or less than 100 nm and the ds/dt ratio is more than 0.15, and a method of manufacturing the semiconductor laser.

Figure 10:
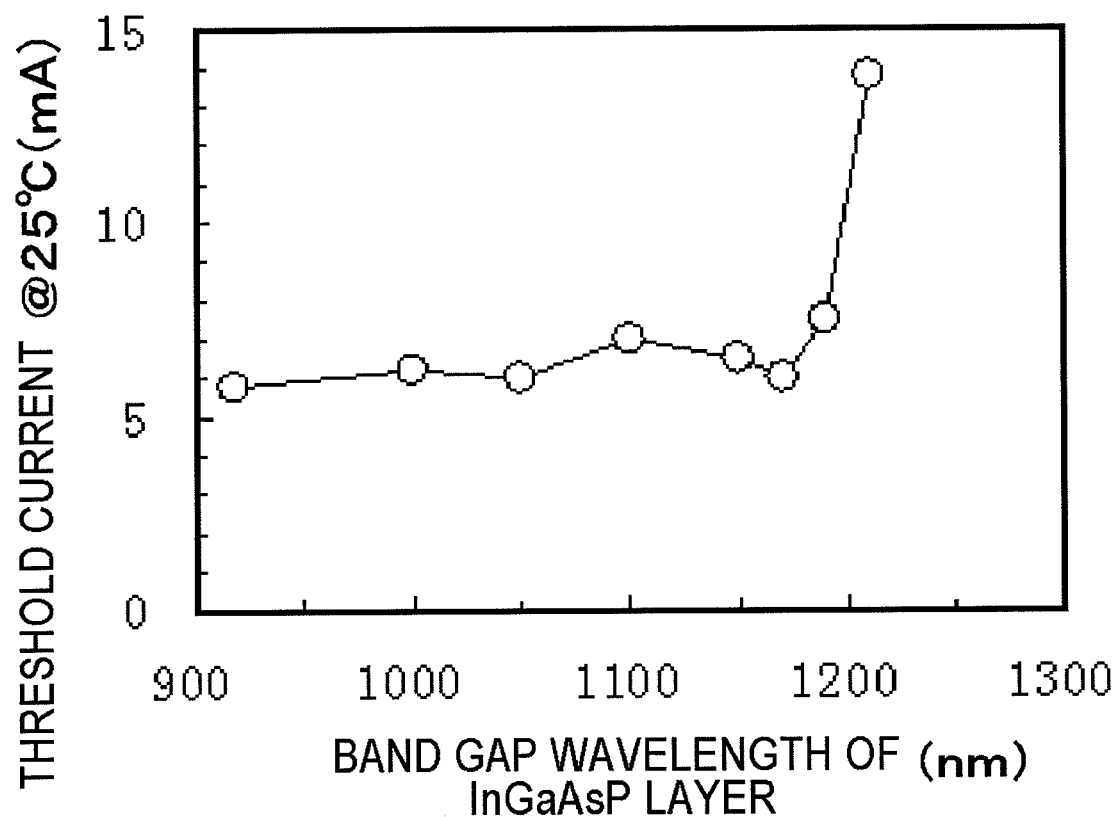
FIG. 10 is a diagram illustrating the relationship between a threshold current of laser oscillation at a temperature of 25° C. and the composition (a wavelength corresponding to a band gap) of the protective layer of the active layer waveguide.

In the first embodiment, the composition capable of a band gap corresponding to a wavelength of 1170 nm is used as the composition of the InGaAsP protective layer. When a As composition of the protective layer is increased for obtaining a long wavelength, the amount of $AsH_3$ supplied is increased during crystal growth. As a result, the effective V/III ratio is increased, and it is possible to form a protective layer with a high ds/dt ratio. However, when the wavelength depended on the composition is excessively long, the protective layer serves as a light absorbing layer, and loss during laser oscillation is increased, which results in an increase in threshold current. FIG. 10 shows the dependence of the threshold current at a temperature of 25° C. on the composition (a wavelength corresponding to the band gap) of the protective layer. When the band gap wavelength of the protective layer is equal to or more than 1210 nm, the threshold current is sharply increased. The gain peak wavelength at a temperature of 25° C. is 1312 nm. Therefore, the band gap wavelength (composition) of the protective layer that does not deteriorate the characteristics of the laser needs to be shorter by 100 nm or more than the gain peak wavelength.

Figure 11:
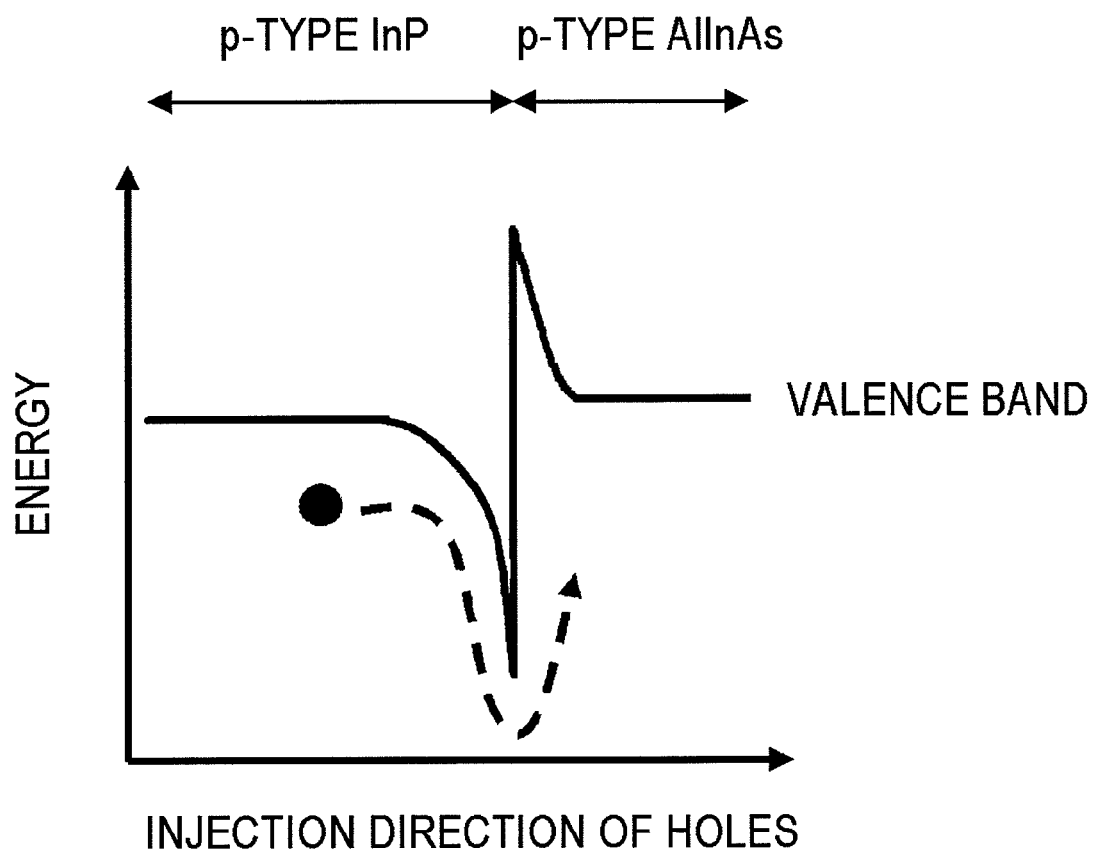
FIG. 11 is a diagram schematically illustrating the band structure of the valence band of p-type AlInAs/p-type InP.
Figure 12:
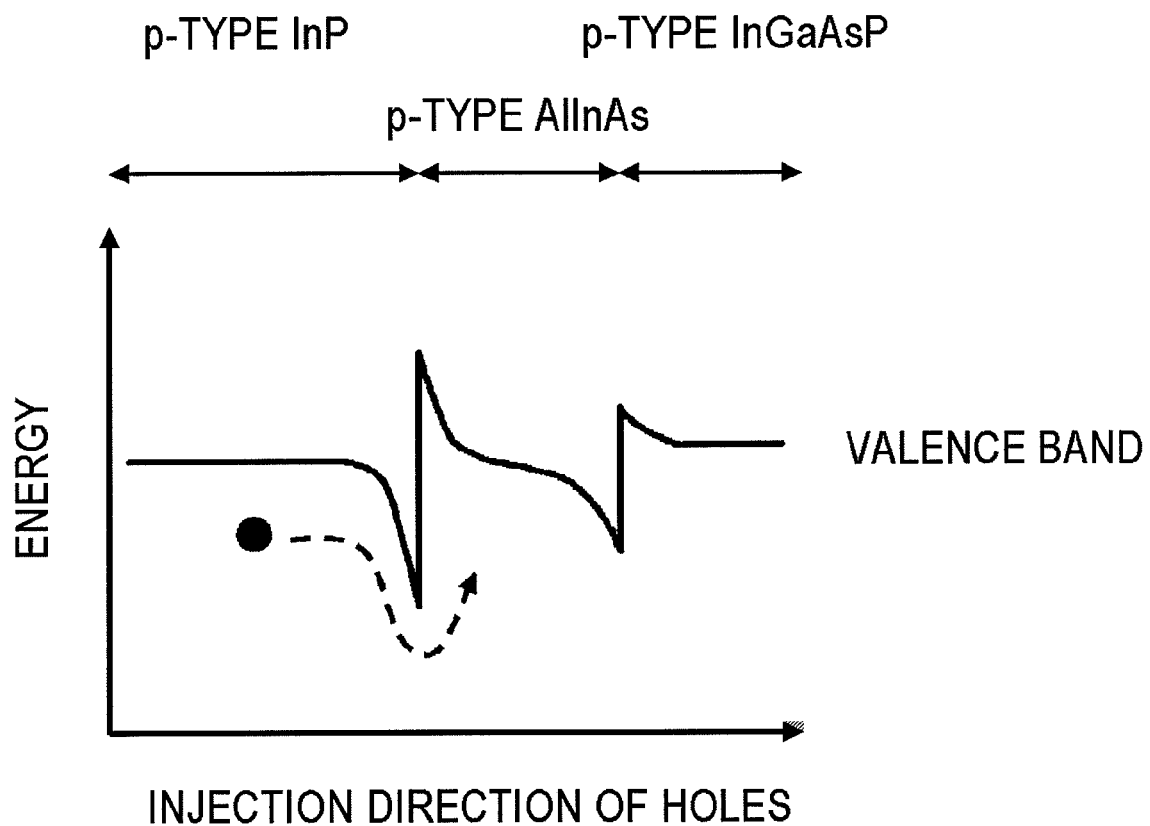
FIG. 12 is a diagram schematically illustrating the band structure of the valence band of p-type AlInAs/p-type InGaAsP/p-type InP.

When an InGaAsP layer is used as the protective layer, a layer structure of the p-type AlInAs electron overflow prevention layer 8/the p-type InGaAsP protective layer 10a/the p-type InP clad layer 13 is provided near the top of the mesa. In this layer structure, the height of the hetero barrier of the valence band is less than that in the structure in which the p-type InGaAsP protective layer 10a is not provided (FIGS. 11 and 12). As a result, holes are easily injected into the active layer, and the differential resistance of the device is reduced or the leakage current to the Fe-doped high-resistance InP current block layer 11 is further reduced.

Second Embodiment

Figure 13A:
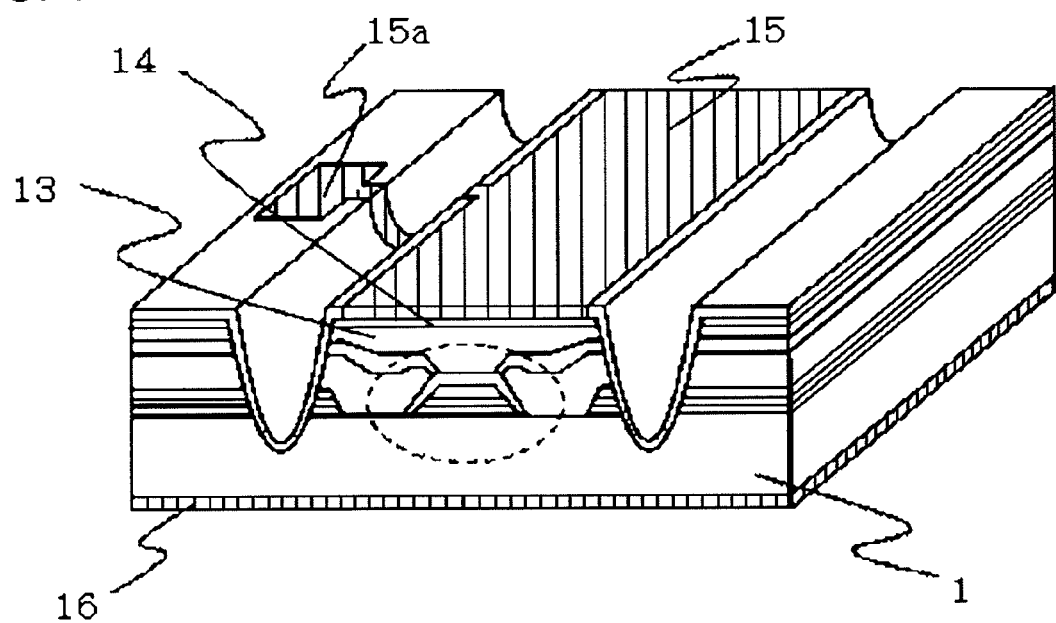
FIG. 13A is a bird's eye view illustrating a Fabry-Perot semiconductor laser according to a second embodiment of the invention in which InGaAsP and InP are used in protective layers of an active layer waveguide.
Figure 13B:
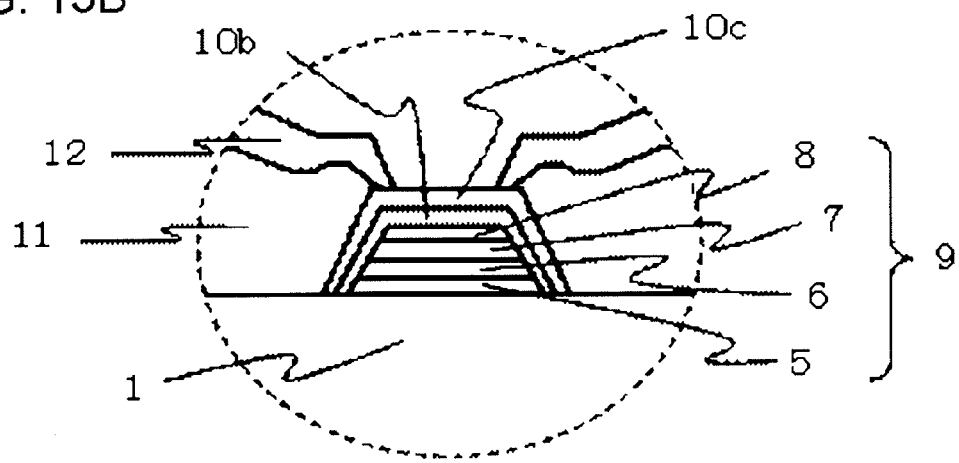
FIG. 13B is a cross-sectional view illustrating near the active layer waveguide.

FIGS. 13A and 13B are a bird's eye view (FIG. 13A) illustrating a Fabry-Perot semiconductor laser (FP-LD) with an embedded structure according to a second embodiment of the invention that includes an AlGaInAs quantum well active layer in which two layers, that is, an InGaAsP layer and an InP layer, are used as protective layers, and a cross-sectional view (FIG. 13B) illustrating near an active layer waveguide, respectively. The second embodiment differs from the first embodiment in that the diffraction grating 2, the n-type InGaAsP guide layer 3, and the n-type InP buffer layer 4 are not provided since the semiconductor laser is an FP-LD. When a semiconductor protective layer has a multi-layer structure, the semiconductor layer (the p-type InGaAsP protective layer 10b) is provided so as to come into contact with the side of the mesa of the active layer (the strain-compensated multiple quantum well active layer 6).

The p-type InGaAsP protective layer 10b (p=$1\times10^{18}$ cm$^{-3}$, no strain, and a wavelength corresponding to the band gap is 1050 nm) and the p-type InP protective layer 10c (p=$1\times10^{18}$ cm$^{-3}$) are used as the protective layers. In the second embodiment, the thickness of the protective layer is observed by SEM. As a result of the observation, the thickness of the p-type InGaAsP protective layer 10b at the top of the mesa is 40 nm, and the thickness of the p-type InP protective layer 10c at the top of the mesa is 60 nm. Therefore, the sum of the thicknesses at the top of the mesa is 100 nm. The thickness of the p-type InGaAsP protective layer 10b at the side of the mesa is 20 nm, and the thickness of the p-type InP protective layer 10c at the side of the mesa is 5 nm. Therefore, the sum of the thicknesses at the side of the mesa is 25 nm. The other structures are the same as those in the first embodiment shown in FIGS. 1A and 1B.

Figure 14:
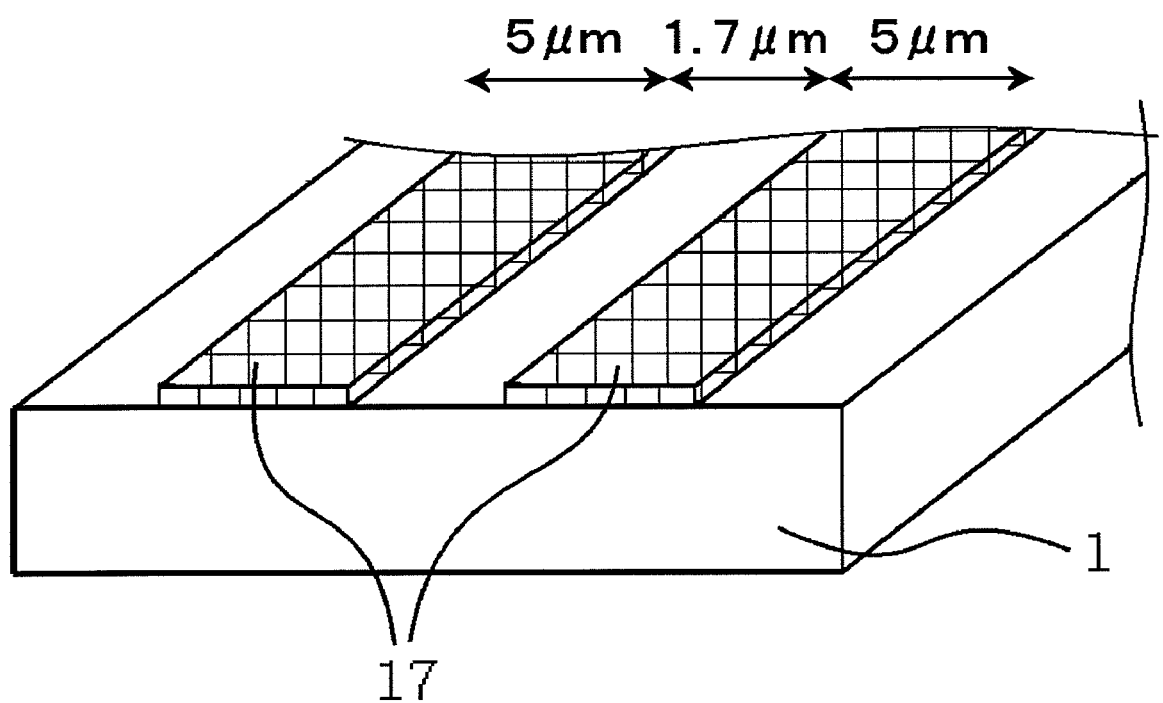
FIG. 14 is a bird's eye view illustrating a portion of a manufacturing process according to the second embodiment of the invention.

Next, a manufacturing process will be described. FIGS. 14 and 15 are bird's eye views illustrating a portion of a process of manufacturing the FP-LD with an embedded structure according to the second embodiment of the invention that includes the AlGaInAs quantum well active layer in which the InGaAsP layer and the InP layers are used as the protective layers.

First, a silicon oxide film with a thickness of 100 nm is deposited on the n-type InP substrate 1 having the (100) plane as a growth plane by a thermal chemical vapor deposition (thermal CVD) method. Then, the silicon oxide film is processed into a pair of strip-shaped silicon oxide masks 17 with a mask width of 5 μm and an opening width of 1.7 μm by a photolithography technique (FIG. 14). The strip extends in the [011] direction.

Figure 15A:
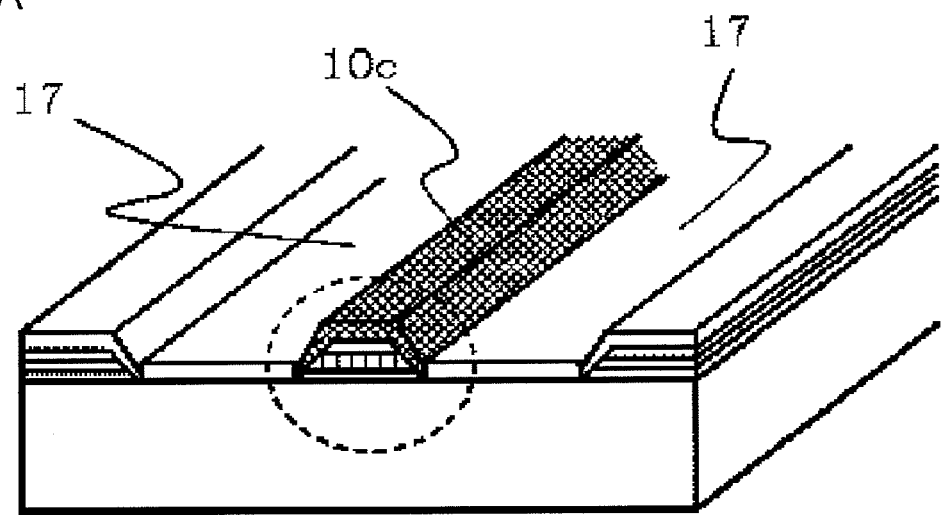
FIG. 15A is a bird's eye view illustrating a portion of the manufacturing process according to the second embodiment of the invention.
Figure 15B:
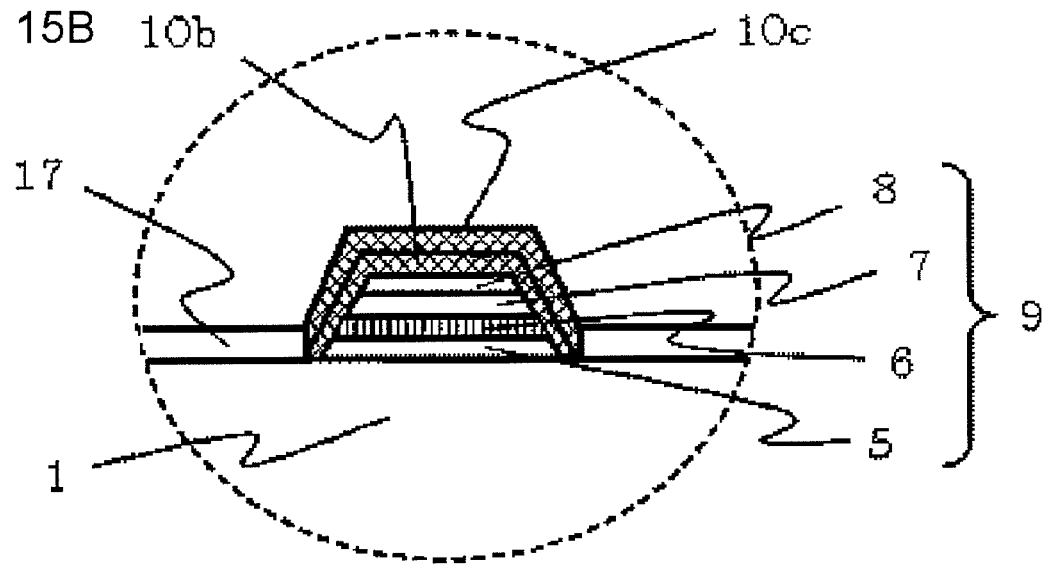
FIG. 15B is a cross-sectional view illustrating a portion of the manufacturing process according to the second embodiment of the invention.

Then, the substrate is set in the MOVPE apparatus, and the n-type AlGaInAs optical guide layer 5, the strain-compensated multiple quantum well active layer 6, the p-type AlGaInAs optical guide layer 7, and the p-type AlInAs electron overflow prevention layer 8 is selectively grown to form the active layer waveguide 9 with a mesa shape. Subsequently, the p-type InGaAsP protective layer 10b and the p-type InP protectively layer 10c are grown so as to cover the entire active layer waveguide 9 without being exposed to the atmosphere (FIGS. 15A and 15B). The growth temperature is 630° C., the growth pressure is 133 hPa, the growth rate of the AlGaInAs layer is 30 nm/minute, the growth rate of the InGaAsP layer is 15 nm/minute, and the growth rate of the InP layer is 10 nm/minute. The V/III ratio in the InGaAsP layer is 90, and the V/III ratio in the InP layer is 600. The subsequent manufacturing process is the same as that in the first embodiment shown in FIGS. 6 to 9.

The manufactured FP-LD is cleaved to have a cavity length of 200 μm, and the both facet is coated such that the reflectivity of the front facet is 40% and the reflectivity of the rear facet is 75%. Then, laser characteristics are evaluated.

As a result, laser oscillation is obtained at a low threshold current, for example, at a threshold current of 5 mA at a temperature of 25° C. and at a threshold current of 12 mA at a temperature of 95° C. The oscillation wavelength is 1298 nm at a temperature of 25° C. The slope efficiency is 0.38 W/A at a temperature of 25° C. and 0.28 W/A at a temperature of 95° C., which is a high level. A variation in slope efficiency between 25° C. and 95° C. is −1.3 dB, which is a relatively small value.

The modulation characteristics at 10 Gb/s are evaluated under a fixed condition of a light output of 10 mW. As a result, a mask margin of 25% or more is obtained in the temperature range of −5° C. to 95° C. in which measurement is performed. In addition, a central current during modulation is 48 mA at a temperature of 95° C., which is a very small value. The value sufficiently satisfies a power consumption of 1 W or less in the SFP+ optical transceiver.

A reliability test is performed on the FP-LD under the conditions of a temperature of 95° C. and a constant light output of 10 mW. As a result of the test, the FP-LD is stably operated for 9000 hours or more. The lifetime of the FP-LD estimated from the increasing rate of an operation current is 500,000 hours or more.

In this embodiment, an InGaAsP layer (a wavelength corresponding to the band gap is 1050 nm) and an InP layer are used as the protective layers. The thickness of the protective layer is observed by SEM. As a result of the observation, the thickness of the p-type InGaAsP protective layer 10b at the top of the mesa is 40 nm, and the thickness of the p-type InP protective layer 10c at the top of the mesa is 60 nm. The sum of the thicknesses at the top of the mesa is 100 nm. The thickness of the p-type InGaAsP protective layer 10b at the side of the mesa is 20 nm, and the thickness of the p-type InP protective layer 10c at the side of the mesa is 5 nm. The sum of the thicknesses at the side of the mesa is 25 nm. Therefore, the ds/dt ratio is 0.25. The ds/dt ratio is higher than that of the structure in which only the InP layer is used as the protective layer disclosed in Japanese Unexamined Patent Publication No. 2003-133647, but is lower than that in the first embodiment in which only the InGaAsP layer is used. However, when the p-type InP protective layer 10c is provided, it is not necessary to simultaneously supply $AsH_3$ and $PH_3$ in the subsequent process of increasing the crystal growth temperature, and it is possible to easily perform a crystal growth process. The thickness of the protective layer (the p-type InGaAsP protective layer 10b and the p-type InP layer 10c) at the top of the mesa corresponding to the width of the leakage path is 100 nm, and it is possible to obtain a thickness of 100 nm or less that is sufficient to make the leakage current negligible.

Figure 16A:
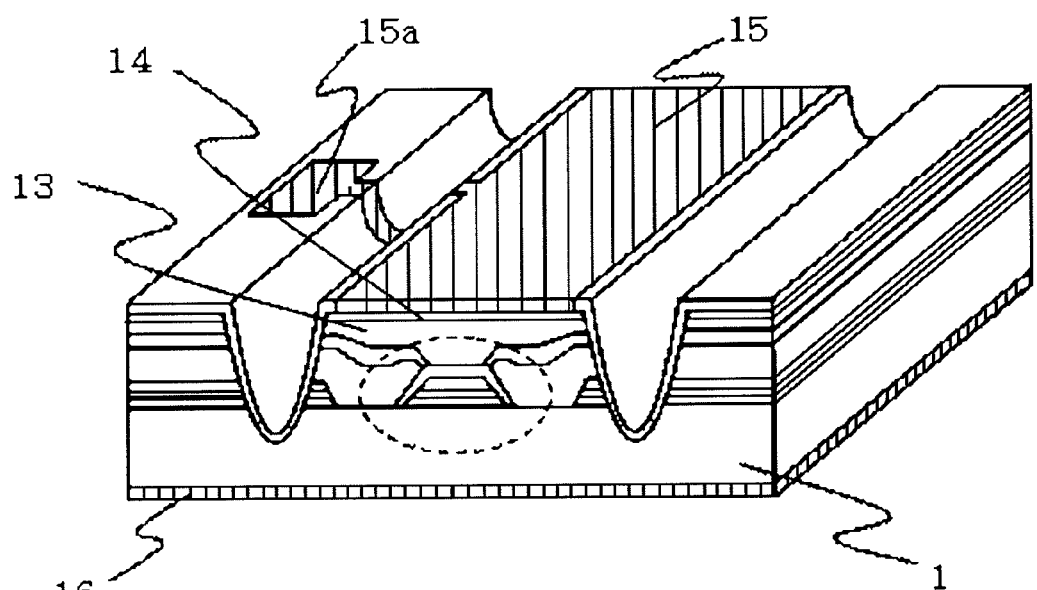
FIG. 16A is a bird's eye view illustrating a Fabry-Perot semiconductor laser according to a third embodiment of the invention in which InAsP and InP are used in protective layers of an active layer waveguide.
Figure 16B:
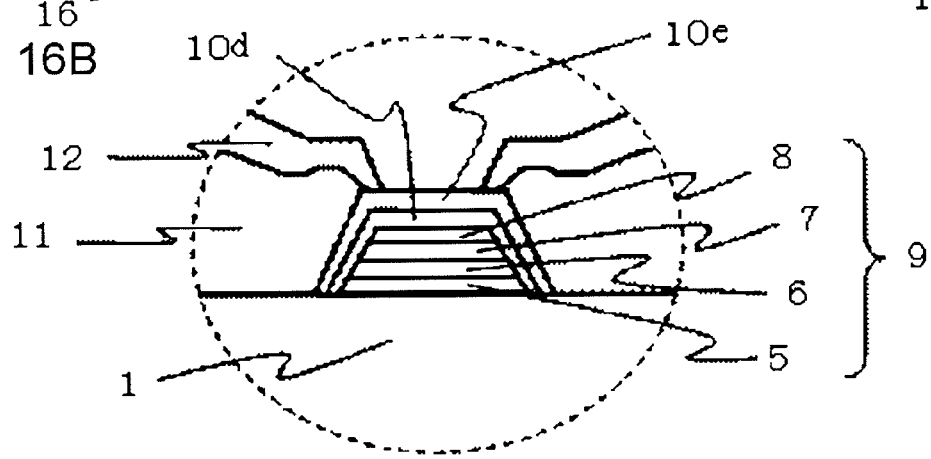
FIG. 16B is a cross-sectional view illustrating near the active layer waveguide.

FIGS. 16A and 16B are a bird's eye view (FIG. 16A) illustrating a Fabry-Perot semiconductor laser (FP-LD) with an embedded structure according to a third embodiment of the invention that includes an AlGaInAs quantum well active layer in which two layers, that is, an InAsP layer and an InP layer, are used as protective layers, and a cross-sectional view (FIG. 16B) illustrating near an active layer waveguide, respectively. The third embodiment differs from the second embodiment in that a p-type InAsP protective layer 10d ($p=1\times10^{18}$ $cm^{-3}$, 0.54% compression strain, and a wavelength corresponding to the band gap is 1050 nm) and a p-type InP protective layer 10e (d=60 nm and $p=1\times10^{18}$ $cm^{-3}$) are used as the protective layers.

The thickness of the protective layer according to this embodiment is as follows. The thickness of the p-type InAsP protective layer 10d at the top of the mesa is 40 nm, and the thickness of the p-type InP protective layer 10e at the top of the mesa is 60 nm. The sum of the thicknesses at the top of the mesa is 100 nm. The thickness of the p-type InAsP protective layer 10d at the side of the mesa is 20 nm, and the thickness of the p-type InP protective layer 10e at the side of the mesa is 5 nm. The sum of the thicknesses at the side of the mesa is 25 nm. The other structures are the same as those shown in FIGS. 13A and 13B. The manufacturing process is similar to that according to the second embodiment except that the p-type InGaAsP layer 10b and the p-type InP protective layer 10c shown in FIG. 14 are changed to the p-type InAsP protective layer 10d and the p-type InP protective layer 10e. In this embodiment, the ds/dt ratio is 0.25, and is higher than that of the structure in which only the InP layer is used as the protective layer disclosed in Japanese Unexamined Patent Publication No. 2003-133647. The thickness of the protective layer (the p-type InAsP protective layer 10d and the p-type InP layer 10e) at the top of the mesa corresponding to the width of the leakage path is 100 nm, and it is possible to obtain a thickness of 100 nm or less that is sufficient to make the leakage current negligible.

Figure 17:
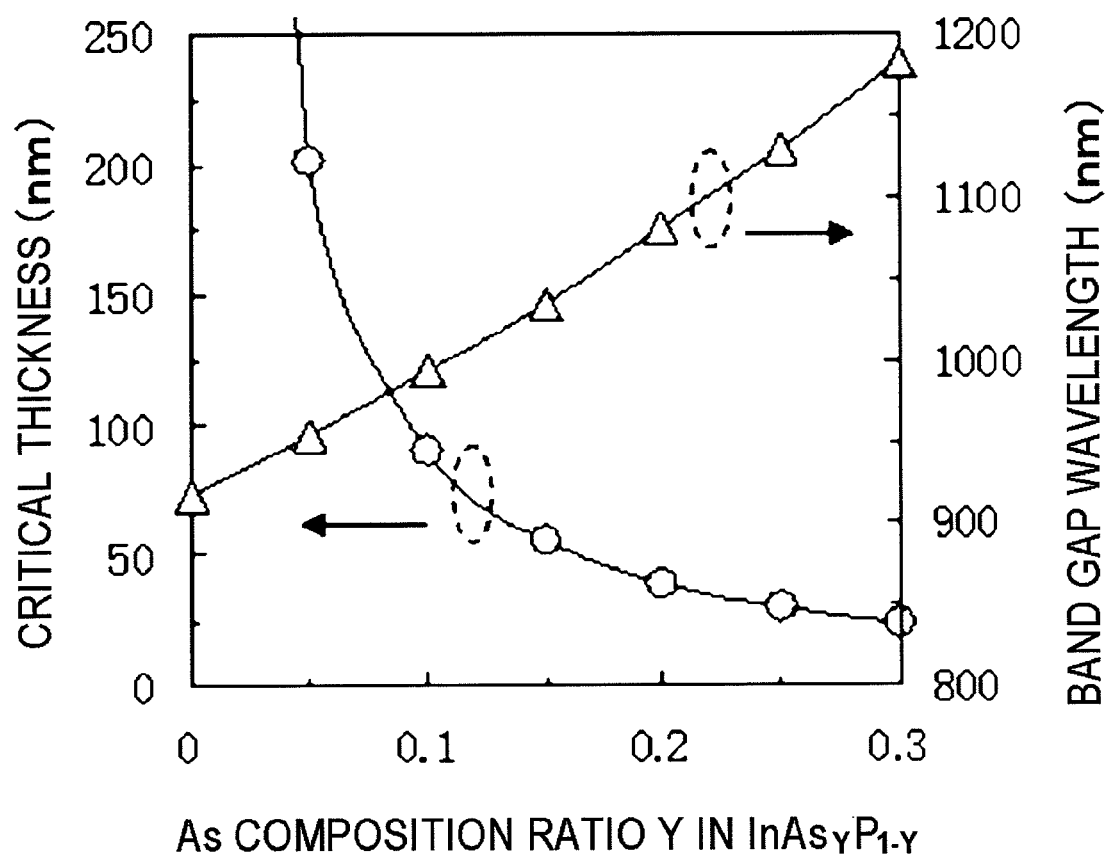
FIG. 17 is a diagram illustrating the critical thickness of an InAsP layer and the dependence of a wavelength corresponding to a band gap on As composition.
Figure 18:
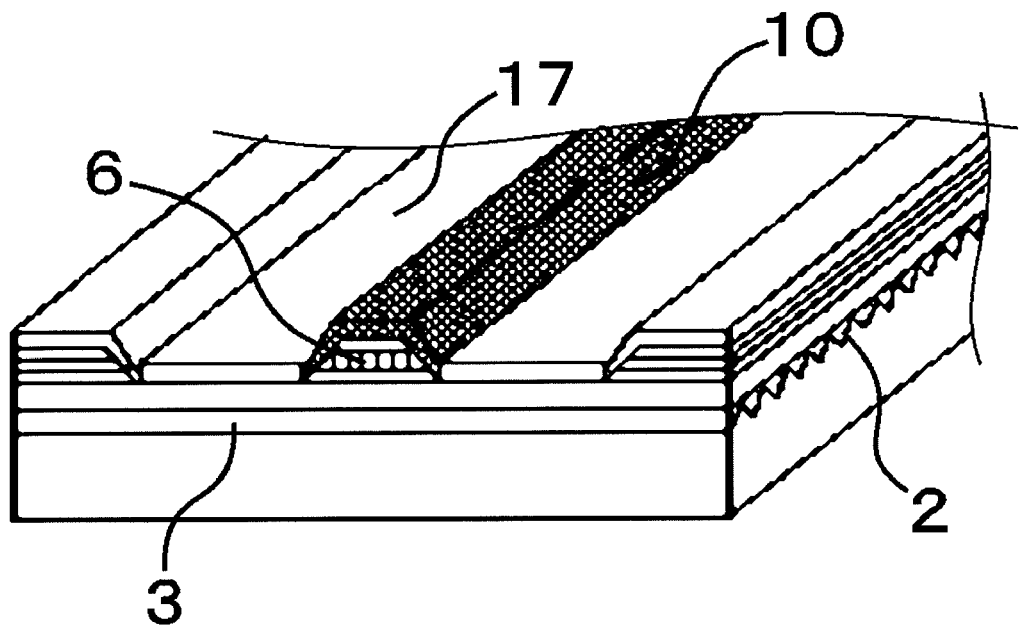
FIG. 18 is a bird's eye view after a mesa structure including an active layer waveguide of a semiconductor laser is selectively grown, which is disclosed in T. Okuda, et al.
Figure 19:
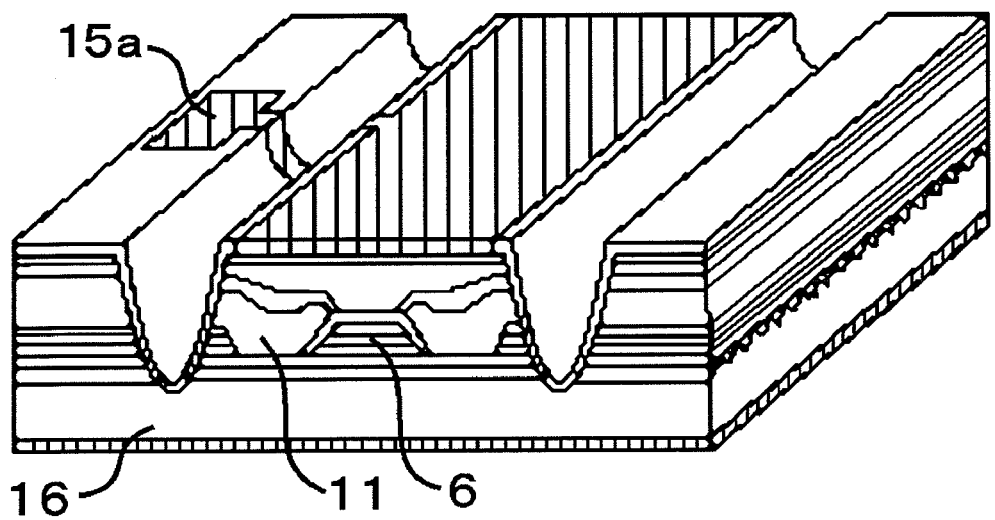
FIG. 19 is a bird's eye view illustrating the semiconductor laser disclosed in T. Okuda, et al.

In this embodiment, the p-type InAsP layer 10d is used as a portion of the protective layer of the active layer waveguide. In this case, it is possible to obtain crystal growth by the supply of only an As source material, as compared to the InGaAsP protective layer that is formed by the supply of a Ga source material and an As source material. Therefore, it is possible to easily to form the protective layers. However, since InAsP is not lattice-matched with the InP substrate, the thickness of the layer formed by crystal growth may not increase as the amount of As is increased. In addition, a wavelength corresponding to the band gap is also increased with the increase in the amount of As. Therefore, there is a limit in the amount of As. FIG. 17 shows the thickness (critical thickness) of the InAsP layer where crystal growth can be performed and the dependence of a wavelength corresponding to the band gap on As composition. In this embodiment, the As composition ratio Y of the p-type $InAs_YP_{1-Y}$ protective layer 10d is set to 0.167. As a result, the critical thickness is 49 nm, and it is possible to manufacture the structure according to this embodiment without lattice relaxation. However, in the process of forming the protective layer, it is possible to increase the thickness of the layer by gradually reducing the amount of As in the InAsP layer in the stacked direction using a vapor deposition method (MOVPE method) that gradually reduces the As composition ratio.

In the first to third embodiments, the laser structure in which the oscillation wavelength or the gain peak wavelength of the laser is around 1300 nm has been described. However, a semiconductor laser with an oscillation wavelength or a gain peak wavelength of 1490 nm or 1550 nm that is used in optical communication may be manufactured by changing the composition of the strain-compensated multiple quantum well active layer. Therefore, the invention can be applied to a semiconductor laser for communication which has an oscillation wavelength or a gain peak wavelength of 1490 nm or 1550 nm and includes an active layer including Al. In particular, in the laser structure with an oscillation wavelength or a gain peak wavelength of 1490 nm or 1550 nm, a wavelength corresponding to the band gap of InGaAsP or InAsP used to form the protective layer may be used for a large amount of As (long wavelength). Therefore, the amount of $AsH_3$ supplied during crystal growth may be also increased, and it is possible to effectively increase the V/III ratio. As a result, it is possible to form a protective layer with a high ds/dt ratio.

In the first to third embodiments, the Fe-doped high-resistance InP layer and the n-type InP layer are used as the current block layers. However, the p-type InP layer and the n-type InP layer disclosed in Japanese Unexamined Patent Publication No. 2003-133647 may be used as the current block layers. In this case, a leakage current flows through the p-type InP layer, and the leakage path is the same as that in the Fe-doped high-resistance InP layer.

A Ru-doped high-resistance InP layer may be used instead of the Fe-doped high-resistance InP layer. In this case, there is a leakage current since the Ru-doped InP layer does not trap holes. Therefore, the invention can be applied to this structure.

In the first to third embodiments, the n-type InP substrate is used as the substrate. However, a high-resistance InP substrate may be used as the substrate. When the high-resistance InP substrate is used, the parasitic capacitance of the device can reduced, which results in an increase in operation speed, or devices can be separated (electrically insulated) from each other in an array laser. It is apparent that the present invention is not limited to the above embodiment, and may be modified and changed without departing from the scope and spirit of the invention.

What is claimed is:

1. A semiconductor laser comprising:
   a substrate;
   an optical waveguide with a mesa structure, that includes an active layer including Al and, is provided over said substrate;
   a semiconductor protective layer that is provided so as to cover the top and the side of the mesa of said optical waveguide;
   a current block layer that is provided so as to embed said optical waveguide and said semiconductor protective layer; and
   a clad layer that is provided over said semiconductor protective layer and said current block layer,
   wherein said semiconductor protective layer has a semiconductor layer that includes As, but does not include Al.

2. The semiconductor laser as set forth in claim 1, wherein said semiconductor layer includes a group III-V compound semiconductor.

3. The semiconductor laser as set forth in claim 1, wherein said semiconductor layer includes an InGaAsP layer or an InAsP layer.

4. The semiconductor laser as set forth in claim 1, wherein a wavelength corresponding to the band gap of said semiconductor layer is 100 nm or more shorter than a gain peak wavelength of said semiconductor laser.

5. The semiconductor laser as set forth in claim 1, wherein said semiconductor protective layer is a single layer or a multi-layer structure.

6. The semiconductor laser as set forth in claim 1, wherein the thickness of the top of the mesa of said semiconductor protective layer is equal to or more than 20 nm and equal to or less than 100 nm.

7. The semiconductor laser as set forth in claim 1, wherein, a ds/dt ratio is more than 0.15, where the thickness of the top of the mesa of said semiconductor protective layer is dt and the thickness of the side of the mesa of said semiconductor protective layer is ds.

* * * * *